(12) United States Patent
Stack et al.

(10) Patent No.: US 7,862,195 B2
(45) Date of Patent: Jan. 4, 2011

(54) MULTIPLE POSITIONED LIGHT SOURCE TO ACHIEVE UNIFORM OR GRADED ILLUMINATION

(76) Inventors: Thomas E Stack, 1515 Eagle Trail, Oxford, MI (US) 48371; David E Douglas, 23545 Roanoke Ave., Oak Park, MI (US) 48237; Samuel S Lee, 1509 Whispering Oaks Way, Pleasanton, CA (US) 94551

( * ) Notice: Subject to any disclaimer, the term of this patent is extended or adjusted under 35 U.S.C. 154(b) by 398 days.

(21) Appl. No.: 11/973,430

(22) Filed: Oct. 9, 2007

(65) Prior Publication Data
US 2008/0094824 A1   Apr. 24, 2008

Related U.S. Application Data

(60) Provisional application No. 60/850,030, filed on Oct. 6, 2006.

(51) Int. Cl.
*A47F 11/10* (2006.01)
(52) U.S. Cl. .................. 362/125; 362/221; 362/249.02; 362/249.05; 362/276
(58) Field of Classification Search .................. 362/125, 362/221, 249.02, 249.05, 276, 646, 800
See application file for complete search history.

(56) References Cited

U.S. PATENT DOCUMENTS

| | | | |
|---|---|---|---|
| 4,298,869 A | 11/1981 | Okuno | |
| 6,158,882 A | 12/2000 | Bischoff, Jr. | |
| 6,222,322 B1 | 4/2001 | Stack | |
| 6,390,643 B1 | 5/2002 | Knight | |
| 6,528,954 B1 | 3/2003 | Lys et al. | |
| 6,641,294 B2 | 11/2003 | Lefebvre | |
| 6,860,628 B2 | 3/2005 | Robertson et al. | |
| 7,004,603 B2 | 2/2006 | Knight | |
| 7,307,391 B2 | 12/2007 | Shan | |
| 7,490,957 B2 * | 2/2009 | Leong et al. | 362/249.05 |
| 7,648,251 B2 * | 1/2010 | Whitehouse et al. | 362/249.03 |
| 2001/0048595 A1 | 12/2001 | Richardson | |
| 2004/0060884 A1 | 4/2004 | Nook et al. | |
| 2005/0265019 A1 | 12/2005 | Sommers et al. | |
| 2005/0281030 A1 | 12/2005 | Leong et al. | |
| 2006/0220052 A1 | 10/2006 | Kamiya et al. | |
| 2006/0222347 A1 | 10/2006 | Wefler | |

FOREIGN PATENT DOCUMENTS

GB    2362207    7/2002

OTHER PUBLICATIONS

Author: Unknown, employee of Modular International, Title: Products: Primary Voltage, Published on Internet http://www.modularinternational.com/product_category.php?cid=3, Accessed on Apr. 27, 2008.

(Continued)

*Primary Examiner*—Stephen F Husar

(57) ABSTRACT

An integrated and modular lighting system is disclosed. The lighting system includes a plurality of modules, each module including at least two echelons of light emitting diodes and a power supply on a common substrate. The modular lighting system is used to provide uniform illumination of an enclosed display stand.

12 Claims, 15 Drawing Sheets

OTHER PUBLICATIONS

Author: Unknown, employee of Modular International, Title: Products: Linears®, Published on Internet http://www.modularinternational.com/product_category.php?cid=6, Accessed on Apr. 27, 2008.

Author: Unknown, employee of Modular International, Title: Products: LED > Uplight Point Fixture, Published on Internet http:/www.modularinternational.com/product.php?pid=363, Accessed on Apr. 29, 2008.

Author: Unknown, presumably employee of LEDs Magazine, Title: NeoPac releases ultra-high-power RGB-based point-light-source LEDs, Published on Internet http://www.ledsmagazine.com/press/12787, Accessed on Apr. 23, 2008.

Author: Unknown, presumably employee of Aerospace Technology Magazine, Title: EMTEQ Lighting & Cabin Systems Newest Wash and Dome Lights, http://www.aerospace-technology.com/contractors/interiors/emteq/press2.html, Accessed on Apr. 13, 2008.

Author: Unknown, presumably employee of Aerospace Technology Magazine, Title: EMTEQ Announces its New Quasar Full Spectrum Mood Lighting System, Published on Internet http://www.aerospace-technology.com/contractors/interiors/emteq/press5.html, Accessed on Apr. 13, 2008.

* cited by examiner

MULTIPLE POSITIONED LIGHT SOURCE TO ACHIEVE UNIFORM OR GRADED ILLUMINATION

PRIORITY

This application claims the benefit of the filing date of U.S. Provisional Patent Application No. 60/850,030 filed Oct. 6, 2006 entitled "Multiple Positioned Point Sources to Achieve Uniform or Graded Illumination" under 35 USC sections 119 and 120, and said Provisional patent application is incorporated herein by reference.

BACKGROUND

The present invention relates to various aspects of the lighting systems. In particular, the present invention relates lighting systems and illumination of partially or fully or enclosed spaces such as product display cases, grocery canopy, and under-shelf lighting in various display appliances.

The use of fluorescent lamps and lighting technology is well known in the lighting art. However, disadvantages of a fluorescent lamp and its ballast include the emission of heat as a side effect, which is counterproductive for use with a cooling apparatus. Further, unsafe conditions may occur in a fluorescent lighting system, including the possibility of high voltage arcing, which could either directly harm the installer, customers, or bystanders, or indirectly by starting a fire. The use of mercury in a fluorescent lamp poses a health hazard to store employees, customers or final consumers due to accidental breakage of a lamp allowing the mercury to contaminate the cabinet interior or product surfaces. Finally, fluorescent bulbs have a limited lifetime, requiring inconvenient replacement.

Attempts have been made in the art to replace the less reliable and higher voltage fluorescent bulbs with more reliable and energy efficient solid state lighting such as light emitting devices. The use of solid state lighting has various advantages; however, some of the disadvantages include the need for separate power supply/power converter units that incur loss of energy and generation of undesired heat. Further, solid state lighting include localized lighting devices that do not provide uniform lighting over a wide area.

Often theater lighting uses multiple localized light sources to adjust illumination to highlight individuals or produce other scenic effects. Differences and size and scale notwithstanding, the result differs from the needs for uniform display of a product or uniform lighting of a personnel compartment.

Accordingly, there remains a need for an improved illumination system and technology for more uniform or controlled gradient illumination of substantially enclosed spaces.

SUMMARY

The need is met by the present invention. In a first embodiment of the present invention, a display stand includes panels that define at least partially enclosed space and also define a mullion, a corner, or both. A lighting fixture runs along the mullion or the corner. The lighting fixture includes an integrated lighting system. Each integrated lighting system integrates a plurality of light emitting diodes and a power supply on a common substrate. The lighting fixture includes an input circuit mounted on the substrate, a power converter circuit mounted on the substrate. The input circuit is adapted to receive alternating current electrical power from an external source. The power converter circuit is connected to the input circuit and connected to the light emitting diodes. The power converter circuit is adapted to convert the input alternating current electrical power to direct current electrical power for consumption by the plurality of light emitting diodes. To the display stand, a motion detector and a controller can be added to control application of power to the lighting fixtures of the display stand.

In a second embodiment of the present invention, a lighting fixture includes an extrusion frame and a plurality of integrated lighting modules engaged to the extrusion frame. Each module includes a substrate, an input circuit mounted on the substrate, a plurality of light emitting diodes mounted on the substrate, and a power converter circuit mounted on the substrate. The input circuit is adapted to receive alternating current electrical power from an external source. The power converter circuit is connected to the input circuit and connected to the light emitting diodes. The power converter is adapted to convert the input alternating current electrical power to direct current electrical power for consumption by the plurality of light emitting diodes. An output circuit is mounted on the substrate, the output circuit connected to the input circuit and adapted to forward the alternating current electrical power to an external device. A first integrated lighting module of the plurality of integrated lighting modules is connected to an alternating current power source via the input circuit of the first integrated lighting module. A second integrated lighting module of the plurality of integrated lighting modules has an input circuit that is connected to the output circuit of the first integrated lighting module.

In the lighting fixture, the first integrated lighting module includes a first number of light emitting diodes and the second integrated lighting module includes a second number of light emitting diodes. The second number of light emitting diodes can be less than the first number of light emitting diodes. In the lighting fixture, the first integrated lighting module has a first length and the second integrated lighting module has a second length. The second length can be less than the first length. In the lighting fixture, the extrusion frame defines multiple insertion slots allowing for engagement of the integrated lighting modules at varying mounting angles relative to the rest of the extrusion frame. In the lighting fixture, the extrusion frame defines at least one groove adapted to engage wire running along the lighting system.

In a third embodiment of the present invention, an integrated lighting system includes a substrate, an input circuit mounted on the substrate, a plurality of light emitting diodes mounted on the substrate, a power converter circuit mounted on the substrate, and an output circuit mounted on the substrate. The input circuit is adapted to receive alternating current electrical power from an external source. The power converter circuit is connected to the input circuit and connected to the light emitting diodes. The power converter is adapted to convert the input alternating current electrical power to direct current electrical power for consumption by the plurality of light emitting diodes. The output circuit is connected to the input circuit and adapted to forward the alternating current electrical power to an external device.

In the integrated lighting system, the power converter can include a power factor correction circuit. In the integrated lighting system, a zener diode can be connected electrically parallel to each of the light emitting diodes. In the integrated lighting system, the following additional components can be connected to the integrated lighting system: a motion sensor and a power switch connected to the motion sensor and to the power converter circuit. The power switch operates to apply power to the converter circuit when motion is detected by the motion sensor.

In a fourth embodiment of the present invention, an integrated lighting system includes a substrate, a first echelon of light emitting diodes; and a second echelon of light emitting diodes. The substrate has a first major surface defining a first plane and a second major surface defining a second plane. The first echelon of light emitting diodes is mounted on the first major surface, the first echelon of light emitting diodes mounted at a first angle relative to the first plane of the substrate, and the first echelon of light emitting diodes including a first number of light emitting diodes. The second echelon of light emitting diodes is mounted on the first major surface, the second echelon of light emitting diodes is mounted at a second angle relative to the first plane of the substrate, and the second echelon of light emitting diodes includes a second number of light emitting diodes. The second number of diodes is different from the first number of diodes, and the first angle is different from the second angle.

In the integrated lighting system, a third echelon of light emitting diodes can be mounted on the first major surface. The third echelon of light emitting diodes is mounted at a third angle relative to the first plane of the substrate, and the third echelon of light emitting diodes includes a third number of light emitting diodes. The third number of diodes is different from the second number of diodes, and the third angle is different from the first angle and the second angle. In the integrated lighting system, the first echelon of light emitting diodes has a first value of a first characteristic and the second echelon of light emitting diodes has a second value of the first characteristic. The first characteristic is one of the following characteristics: emission color, emission intensity, angle of emission cone, and focus.

In a fifth embodiment of the present invention, a lighting fixture includes an extrusion frame and an integrated lighting module engaged to the extrusion frame. Each integrated lighting modules includes a substrate, an input circuit, a plurality of light emitting diodes, and a power converter. The input circuit is mounted on the substrate. The input circuit is adapted to receive alternating current electrical power from an external source. The plurality of light emitting diodes is mounted on the substrate. The power converter circuit is mounted on the substrate. The power converter circuit is connected to the input circuit and connected to the light emitting diodes. The power converter is adapted to convert the input alternating current electrical power to direct current electrical power for consumption by the plurality of light emitting diodes. The integrated lighting module has a first end pivotally engaged to the extrusion frame. The integrated lighting module has a second end movably engaged to the extrusion frame whereby the integrated lighting module is angularly movable relative to the extrusion frame.

In a sixth embodiment of the present invention, a light emitting diode package includes a a light emitting diode and a zener diode. The light emitting diode is encased within a clear epoxy packaging material. The light emitting diode connected to two metal leads coming out of the epoxy packaging. The zener diode is placed within the epoxy packaging. The zener diode connected electrically parallel to the light emitting diode.

DETAILED DESCRIPTION

The present invention will now be described with reference to the FIGS. 1 through 23 which illustrate various aspects, embodiments, or implementations of the present invention. In the Figures, some sizes of structures, portions, or elements may be exaggerated relative to sizes of other structures, portions, or elements for illustrative purposes and, thus, are provided to aid in the illustration and the disclosure of the present invention.

Figure 1:
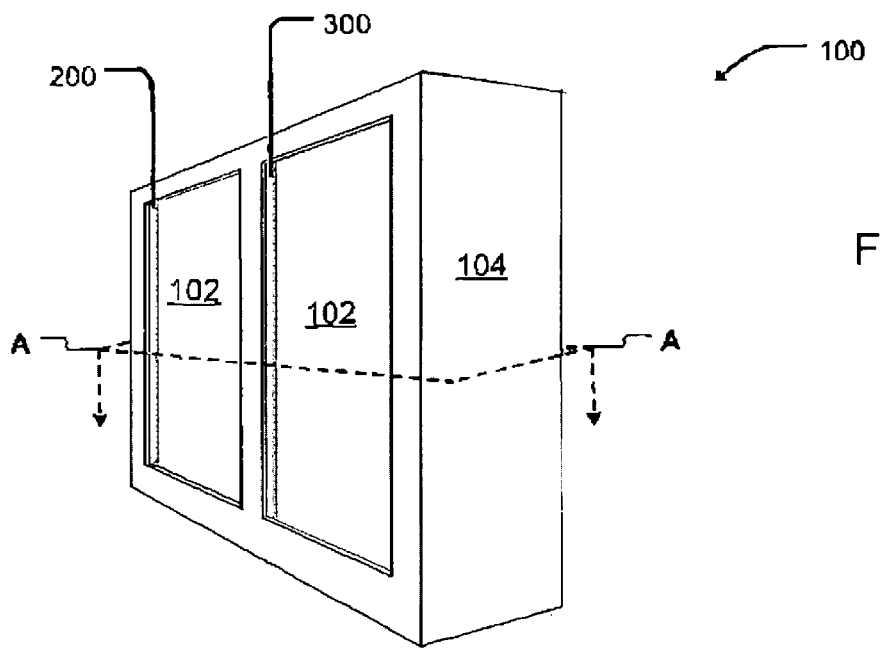
FIG. 1 is a perspective view of a display stand embodying one aspect of the present invention.

FIG. 1 illustrates one aspect of the present invention. According to the illustrated aspect of the present invention, a display stand 100 includes a number of panels such as side panels 104 and doors or windows 102 either of which may be openable. In FIG. 1, the display stand 100 is illustrated as a display case defining is substantially enclosed space. However, the present invention is applicable to many contexts and appliances such as, for example, grocery display fixtures in supermarkets; salad display stations at restaurants.

The panels 104 and doors or windows 102 meet to define mullions, corners, or both. In FIG. 1, the display stand 100 includes lighting fixtures 200 and 300 running along a corner and a mullion of to display stand 100, respectively.

Figure 2:
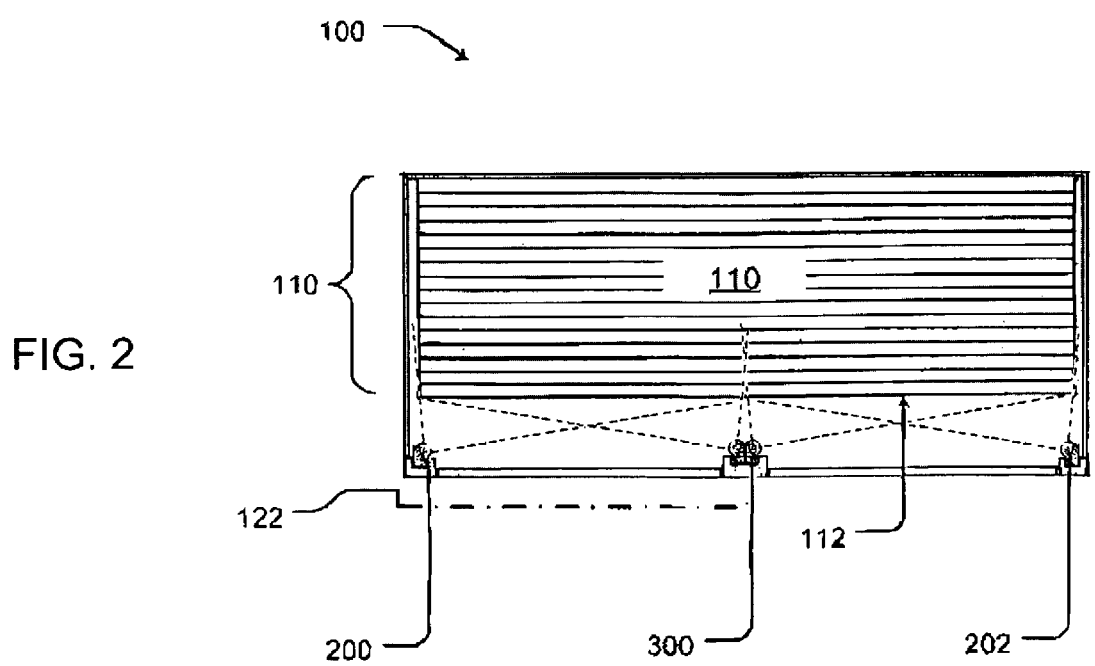
FIG. 2 is a cut away cross sectional view of the display case of the FIG. 1 cut along plane A-A of FIG. 1.

FIG. 2 illustrates a cut-away sectional view of the display stand 100 cut along plane A-A looking downward. Referring now to FIGS. 1 and 2, reference number 110 refers to a shelf within the display stand 100, the shelf 110 on which the products for sale are placed. Reference number 112 refers to a leading edge of the shelf 110, the leading edge 112 being proximal to the front of the display stand 100. Illustrated in FIG. 2 is another lighting fixture 202 not illustrated in FIG. 1 because it would be hidden from view by the side panels 104 and doors or windows 102.

Figure 3:
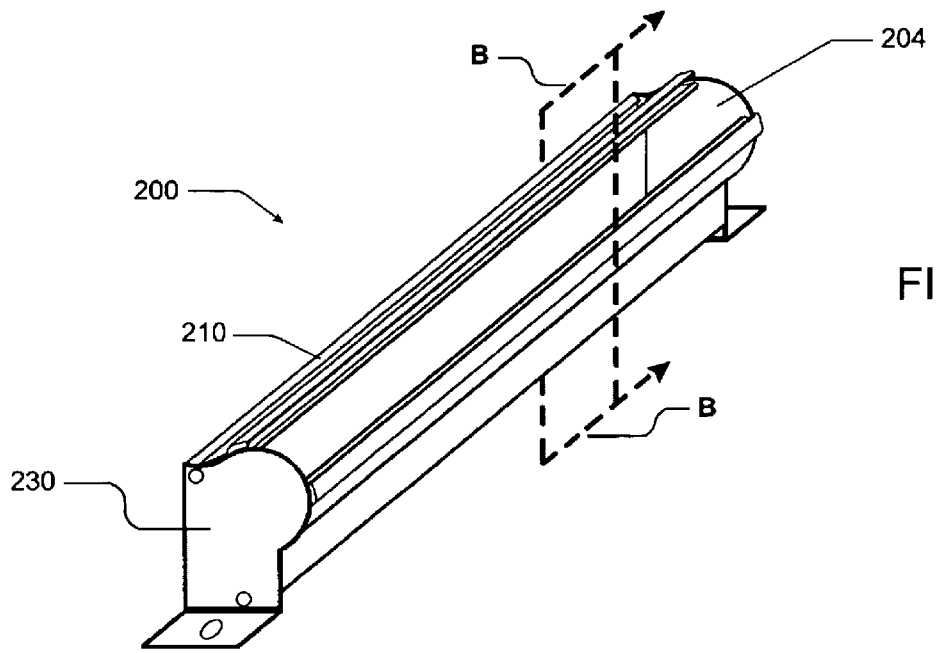
FIG. 3 is a perspective view of an end jamb fixture embodying another aspect of the present invention.
Figure 4:
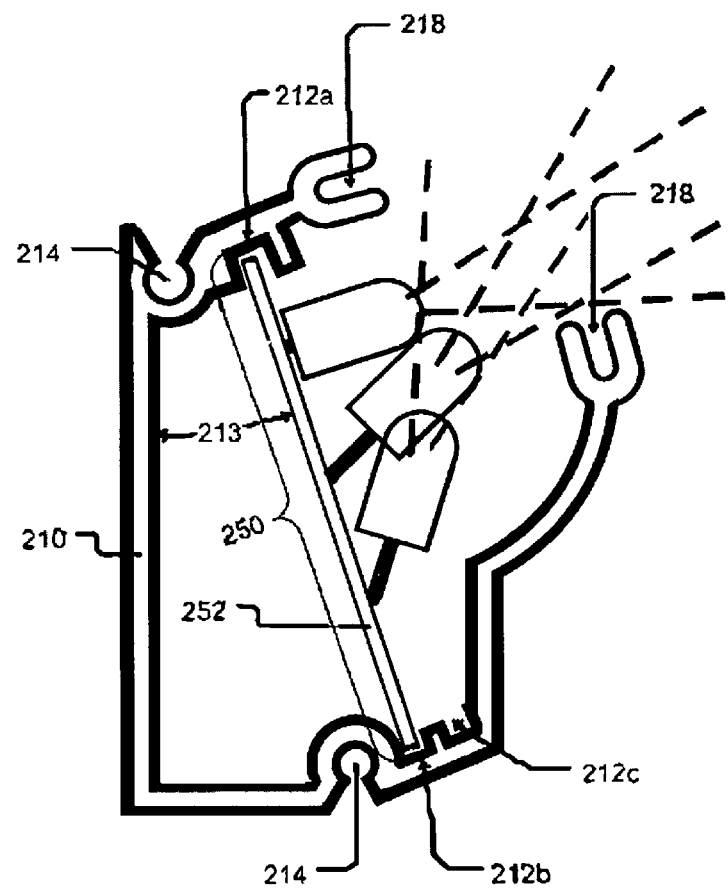
FIG. 4 is a cut away cross sectional view of portions of the end jamb fixture of FIG. 3 cut along plane B-B.

FIG. 3 is a perspective view of the lighting fixture 200 in FIGS. 1 and 2. Here, the lighting fixture 200 is an end jamb fixture 200 adaptable for placement at a corner of the display stand 100 of FIG. 1. The end jamb fixture 200 includes a fixture frame 210 defining an opening covered by a covering lens 204. Ends of the frame 210 are covered by end plates 230. FIG. 4 illustrates a cut away sectional view of the end jamb fixture 200 cut along plane B-B. To avoid clutter, the covering lens 204 is not illustrated in FIG. 4. Illustrated in a FIG. 4 but not shown in FIG. 3 is a cutaway side view of an integrated lighting system 250. The integrated lighting system 250 is also referred to herein as an "integrated lighting module" or just "module." Reference number 250 is used to generically or collectively refer to an integrated lighting module. A particular integrated lighting module is referred to herein as 250a, 250b, or 250c as illustrated in FIG. 5.

Figure 5:
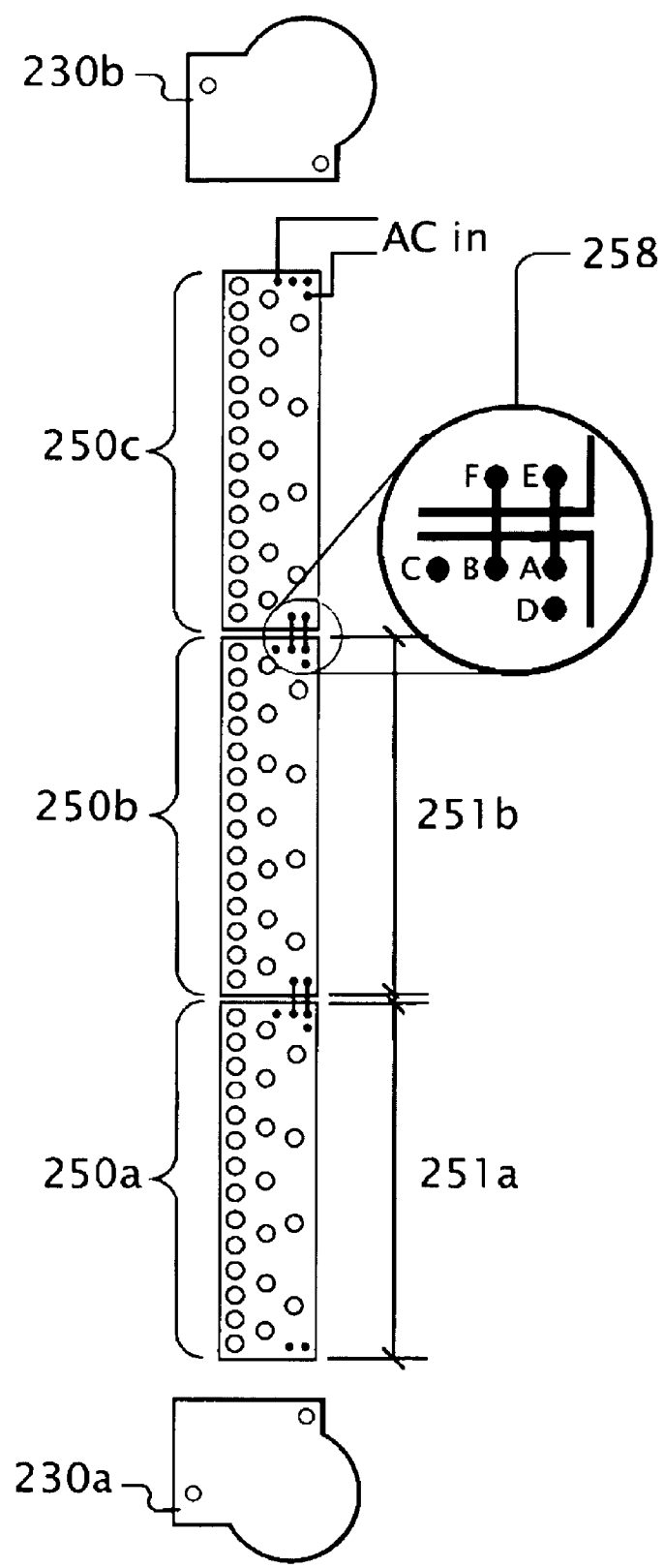
FIG. 5 illustrates portions of the end jam fixture at a different detail.
Figure 6:
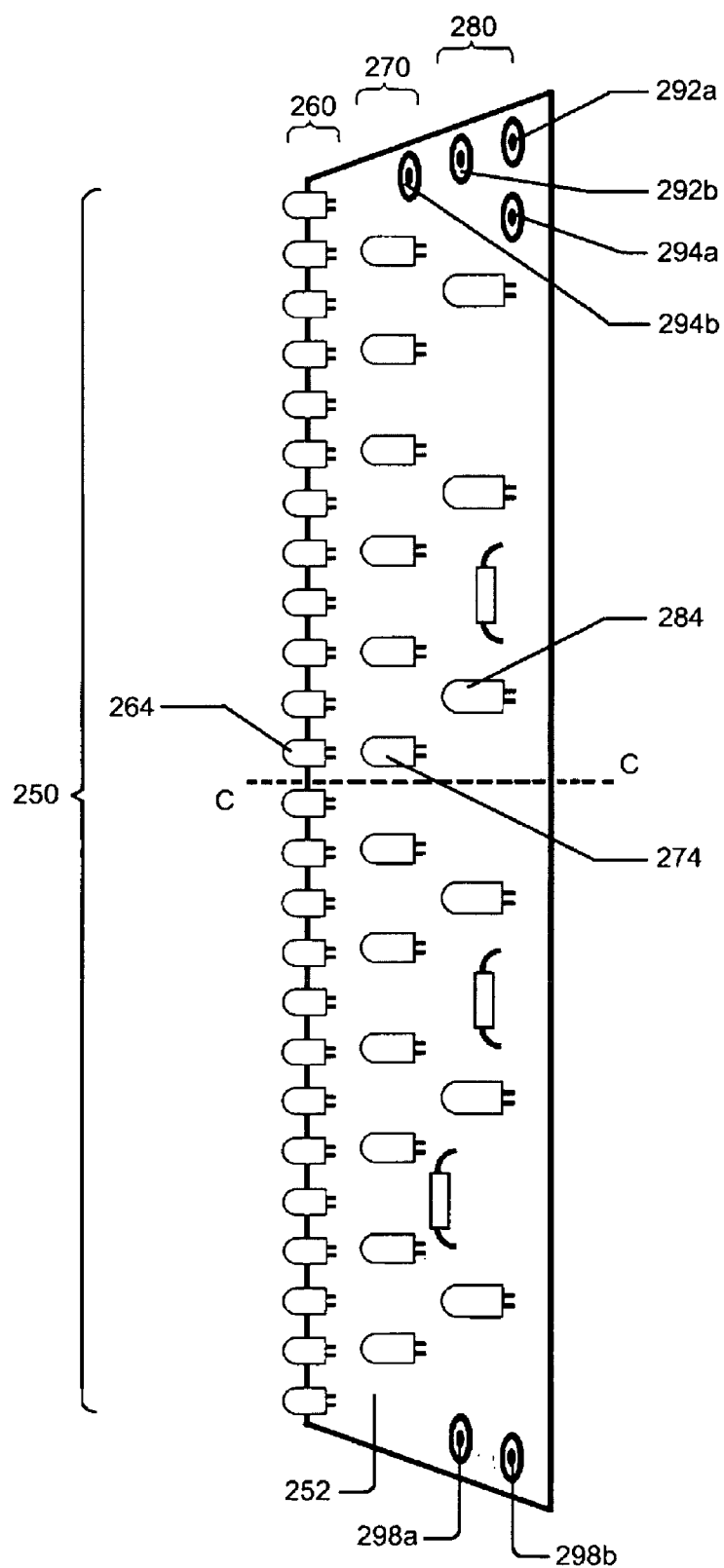
FIG. 6 is a more detailed view of an integrated lighting module component of the end jamb fixture of FIG. 3.
Figure 7:
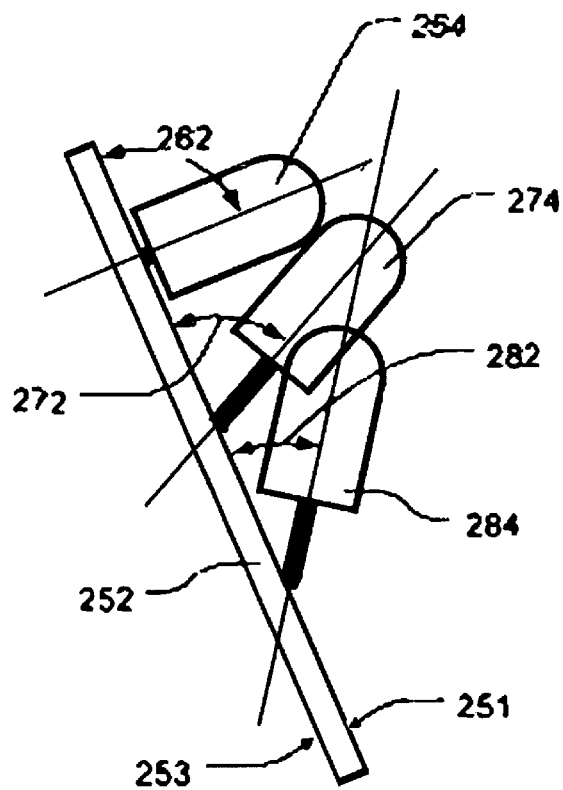
FIG. 7 is a cut away sectional view of an integrated lighting module of FIG. 6 along line C-C.

FIGS. 5 through 7, 10A through 11, 13, 14A, and 14B illustrate various portions of the end jamb fixture 200 in more detail. FIG. 5 illustrates the integrated lighting modules 250 of the end jamb fixture 200 including a more detailed view of the connections between the modules 250. FIG. 6 is a more detailed view of the integrated lighting module 250. FIG. 7 illustrates another cut away sectional view of one of the integrated lighting modules 250 cut along line C-C.

Referring to FIGS. 3 to 7, the illustrated end jamb fixture 200 includes three integrated lighting systems 250. The number of integrated lighting modules 250 in a lighting fixture such as the end jamb fixture 200 can vary from one to many. Two End Plates 230a and 230b are attached to the ends of the frame 210, one at each end. For convenience of discussion herein, the End Plates, generically or collectively, are referred to using reference number 230. The end plate 230 includes a stress relief 232, and defines several openings such as, for example only, wire access opening 234, end plates screw hole 236, and mounting hole 239. Also, a ground lug engagement hole 238 allows for electrical grounding of the electrical components of the integrated lighting modules 250.

The integrated lighting module 250 includes a plurality of light emitting diodes (LEDs) and power supply on a common substrate 252. The substrate 252 can be any suitable material such as, for example, a printed circuit board (PCB), that is substantially flat. The substrate 252 has a first major surface 251 defining a first plane and a second major surface 253 defining a second plane.

The light emitting diodes are mounted on the first major surface 251 and are arranged in a number of columns or rows depending on the orientation of the module 250. In this discussion, word "echelon" will refer to the linear arrangement of light emitting diodes, not necessarily constrained as to direction, as the words "row" or "column" might signify. The module 250 includes at least two echelons of light emitting diodes. In the embodiment illustrated in the Figures, three echelons are shown.

A first echelon 260 of light emitting diodes is mounted on the first major surface 251. The light emitting diodes of the first echelon 260 are mounted at a first angle 262 relative to the first plane of the substrate 252. The first angle 262 can be, in the illustrated sample embodiment, is approximately 90 degrees. In the Figures, light emitting diode 264 represents a single representative light emitting diode of the first echelon 260 of light emitting diodes. Actual number (the first number) of the light emitting diodes in the first echelon 260 is implementation dependent and can vary widely from one to thousands or more. In the illustrated sample embodiment, the first echelon 260 of light emitting diodes includes about 20 to 30 light emitting diodes per 12 inches, or about two light emitting diodes per inch, the distance measured along the direction of the echelon.

A second echelon 270 of light emitting diodes is mounted on the first major surface 251. The light emitting diodes of the second echelon 270 are mounted at a second angle 272 relative to the first plane of the substrate 252. The second angle 272 can be, in the illustrated sample embodiment, is approximately 63 degrees. In the Figures, light emitting diode 274 represents a single representative light emitting diode of the second echelon 270 of light emitting diodes. Actual number (the second number) of the light emitting diodes in the second echelon 270 is implementation dependent and can vary widely from one to thousands or more. In the illustrated sample embodiment, the second echelon 270 of light emitting diodes includes about 5 to 15 light emitting diodes per 12 inches, or about two light emitting diodes per inch, the distance measured along the direction of the echelon.

Typically, the second number of diodes is different from the first number of diodes and the second angle is different from the first angle. This is because, in most implementations, the second echelon 270 of light emitting diodes and the first echelon 260 of light emitting diodes are intended to illuminate different areas, at different intensities, or both. However, in certain applications, the second number of diodes and the first number of diodes may be equal. Likewise, in certain applications, the second angle and the first angle may be equal. These applications are still within the scope of the present invention.

A third echelon 280 of light emitting diodes is mounted on the first major surface 251. The light emitting diodes of the third echelon 280 are mounted at a third angle 282 relative to the first plane of the substrate 252. The third angle 282 can be, in the illustrated sample embodiment, is approximately 35 degrees. In the Figures, light emitting diode 284 represents a single representative light emitting diode of the third echelon 280 of light emitting diodes. Actual number (the third number) of the light emitting diodes in the third echelon 280 is implementation dependent and can vary widely from one to thousands or more. In the illustrated sample embodiment, the third echelon 280 of light emitting diodes includes about 1 to 9 light emitting diodes per 12 inches, or about two light emitting diodes per inch, the distance measured along the direction of the echelon.

Typically, the third number of diodes is different from both the first number of diodes and the second number of diodes. Likewise, the third angle is typically different from both the first angle and the second angle. This is because, in most implementations, the third echelon 280 of light emitting diodes, the first echelon 260 of light emitting diodes, and the second echelon 270 of light emitting diodes are intended to illuminate different areas, at different intensities, or both. However, in certain applications, the third number of diodes may be same as the first number of diodes, the second number of diodes, or both the first number and the second number of diodes. Likewise, in certain applications, the third angle may be same as the first angle, the second angle, or both. These applications are still within the scope of the present invention.

Figure 8:
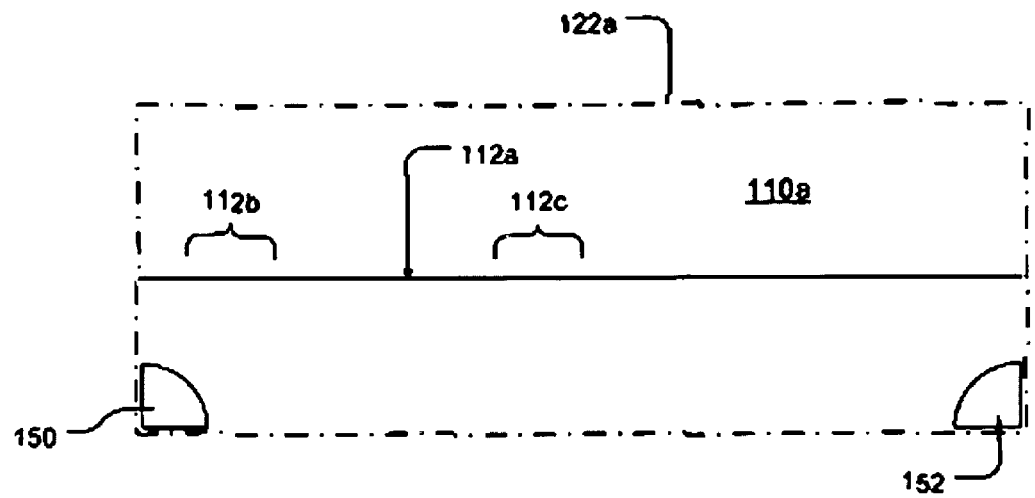
FIG. 8 illustrates a portion of a prior art display stand.

The reason for the differences in the number of light emitting diodes of the three echelons of diodes and the reason for the differences in the angle in which the light emitting diodes of the three echelons are mounted can be explained using FIG. 8 which illustrates a portion of a display stand of a prior art design.

Light uniformity or desired grading is achieved by controlling various factors such as the spacing between the light emitting diodes within each echelon, angle at which the light emitting diodes are mounted, etc. In the illustrated sample configuration, light from the light emitting diodes of various echelons cross each other. This is because of the varying angles in at which the light emitting diodes are mounted. For this reason, this arrangement is sometime referred to as cross fire design.

As discussed above, FIG. 2 illustrates a cut-away sectional view of the display stand 100 (of FIG. 1) cut along plane A-A looking downward. A portion 122 of the cut-away sectional view of the display stand 100 is indicated in FIG. 2. The portion 122 is illustrated in more detail in FIGS. 9A, 9B, and 9C to aid in the discussion of the resultant and the desired effects of the configuration of the integrated lighting module 250.

FIG. 8 illustrates an analogous portion 122a of a prior art display stand (not illustrated) that has a similar or same configuration of the display stand 100 (of FIG. 1) but without the lighting fixtures 200, 300 of the present invention. Rather, the prior art display stand includes prior art lighting systems 150 and 152 that provide light of substantially uniform density. Such prior art lighting systems 150 and 152 can be, for example, fluorescent lamps 150 and 152. The analogous portion 122a (of the prior art display stand) is analogous to portion 122 (of the display stand 100 of the present invention). Reference number 112a refers to a leading edge of a shelf 110a within the prior art display stand. The leading edge 112a is analogous to the leading edge 112 of the shelf 110 within the display stand 100 of the present invention illustrated in FIGS. 1 and 2. The leading edge 112a represents front of products placed on the self 110a for sale.

In the prior art display stand, the illumination of the leading edge 112a is not uniform. For example, a first portion 112b of the leading edge 112a is more intensely illuminated, that is, relatively brighter, compared to a second portion 112c of the of the leading edge 112a which is less intensely illuminated, that is, relatively darker. This is because, the first portion 112b is relatively closer to the uniform light source 150 than the second portion 112 see which is relatively farther from the uniform light source 150.

Figure 9A:
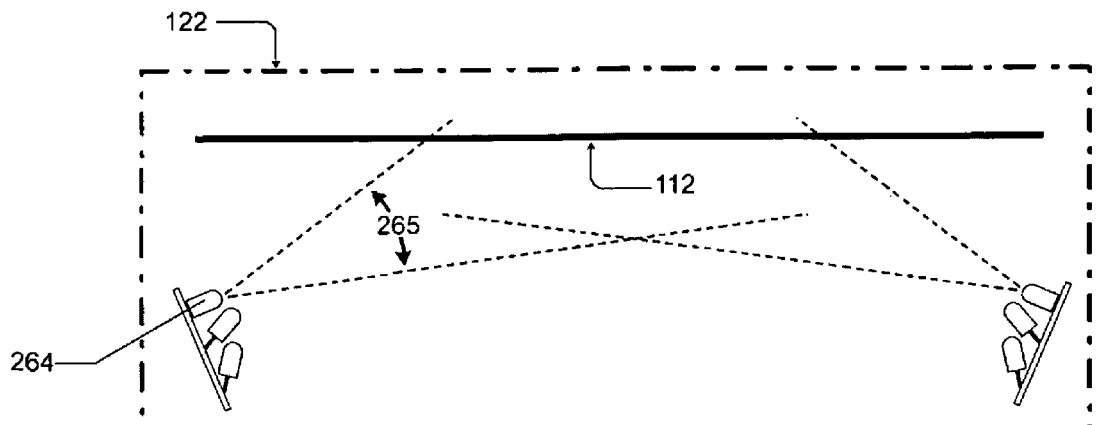
FIGS. 9A, 9B, and 9C illustrate a portion of FIG. 2 in a greater detail.
Figure 9B:
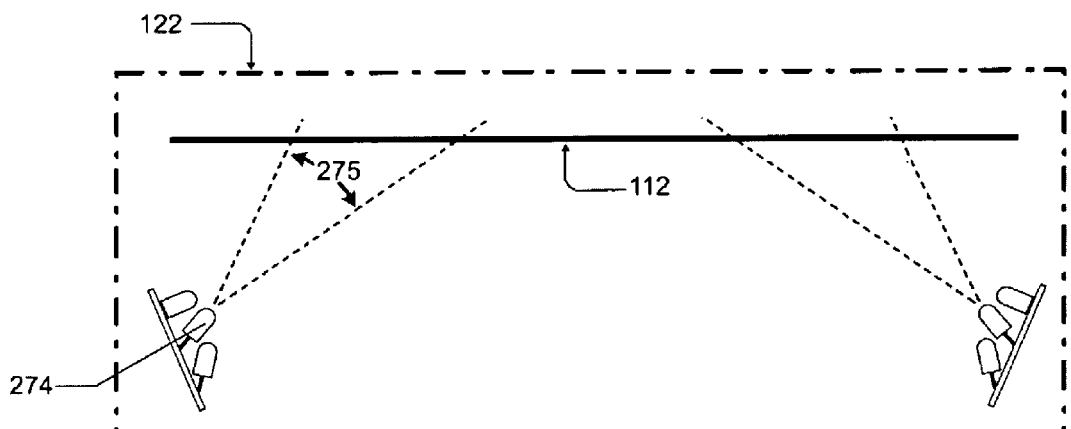
Figure 9C:
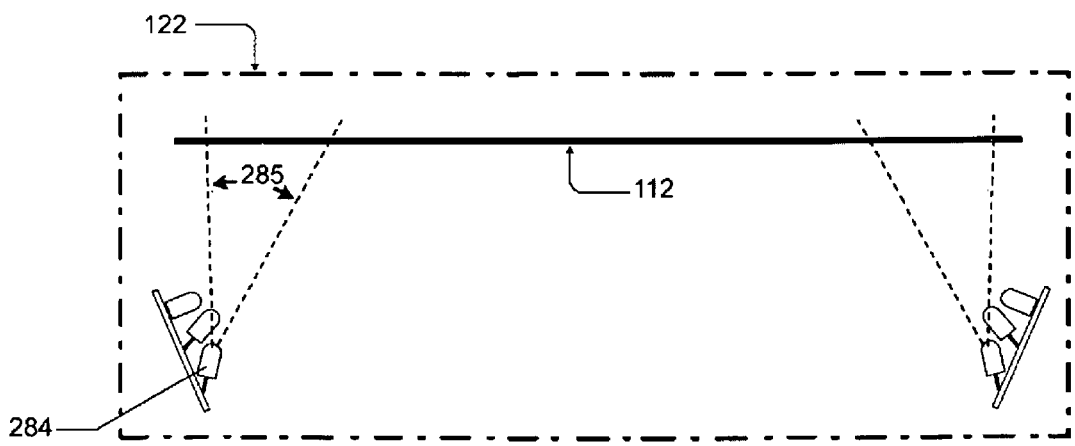

In many applications, a more uniform illumination of the products placed on the shelf 110a is desired. The present invention provides for a more uniform illumination of the products on the shelf. This is illustrated in FIGS. 9A, 9B, and 9C where the portion 122 of the display stand 100 is illustrated in more detail. Referring to FIGS. 9A, 9B, and 9C and continuing to refer to FIG. 2, the light emitting diodes of the first echelon 260, as represented by the representative light emitting diode 264, illuminates portions of the leading edge 112 that is relatively farthest from the fixture 200. This can be realized using the combination of the following factors: (1) predefined emission cone angles of the light emitting diodes; (2) the angle at which echelons of diodes are mounted on the substrate to 252; and (3) the number of light emitting diodes at each echelon.

The light emitting diodes of the first echelon 260 have predefined emission cones within which most of the light of the light emitting diodes is emitted, the emission cone for the light emitting diode 264 is represented in the Figures by the measurement angle 265. In the market, light emitting diodes of various characteristics are available. One of the characteristic is the angle of the emission cone. In the illustrated sample embodiment of the present invention, the light emitting diodes have emission cone angle of approximately 40°.

The light emitting diodes of the second echelon 270, as represented by the representative light emitting diode 274, illuminate portions of the leading edge 112 that is relatively closer to the fixture 200 than the portions illuminated by the light emitting diodes of the first echelon 260 but that is relatively father from the fixture 200 then portions illuminated by the light emitting diodes of the third echelon 280. The light emitting diodes of the second echelon 270 have predefined emission cones within which most of the light of the light emitting diodes is emitted, the emission cone for the light emitting diode 274 is represented in the Figures by the measurement angle 275. The angle 275 may be same as or different from the angle 265 depending on application.

The light emitting diodes of the third echelon 280, as represented by the representative light emitting diode 284, illuminate portions of the leading edge 112 that is relatively closer to the fixture 200 than the portions illuminated by the light emitting diodes of the first echelon 260 as well as the portions illuminated by the light emitting diodes of the second echelon 270. The light emitting diodes of the third echelon 270 have predefined emission cones within which most of the light of the light emitting diodes is emitted, the emission cone for the light emitting diode 284 is represented in the Figures by the measurement angle 285. The angle 285 may be same as or different from the angle 265, angle 275, or both, depending on application.

The portions of the leading edge 112 illuminated by the three echelons of diodes may overlap depending on the light emission cone angles 265, 275, and 285, and the mounting angle at which the diodes of the first echelon 260, the second echelon 270, and the third echelon 280 at which the diodes are mounted on the substrate 252.

If, in the present invention, the light emitting diodes of the three echelons of diodes in the light having the same intensity, and the number of diodes in each echelon of diodes is same, then the illumination of the lead edge 112 would not be uniform, however, in the present invention, the number of diodes in the three echelons of diodes are different, as illustrated in the Figures, the first echelon 250 of diodes include a higher number (first number) of diodes than the number of diodes (second number) of the second echelon 270. Likewise, the second number is greater than the number of diodes (third number) of the third echelon 280. Accordingly, a more uniform illumination of the leading edge 112 of the shelf 110 of the display stand 100 is realized.

In alternate embodiments of the present invention, other illumination effects can be achieved by using diodes having different values of various characteristics. For example, the first echelon 260 of diodes can have a first value of a first characteristic such as having value red of characteristic color in the diodes of the second echelon 270 can have value to of characteristic color. They characteristics of the diodes for which the values can be selected include, for example only, emission color, emission intensity, angle of emission cone, and focus.

Figure 10:
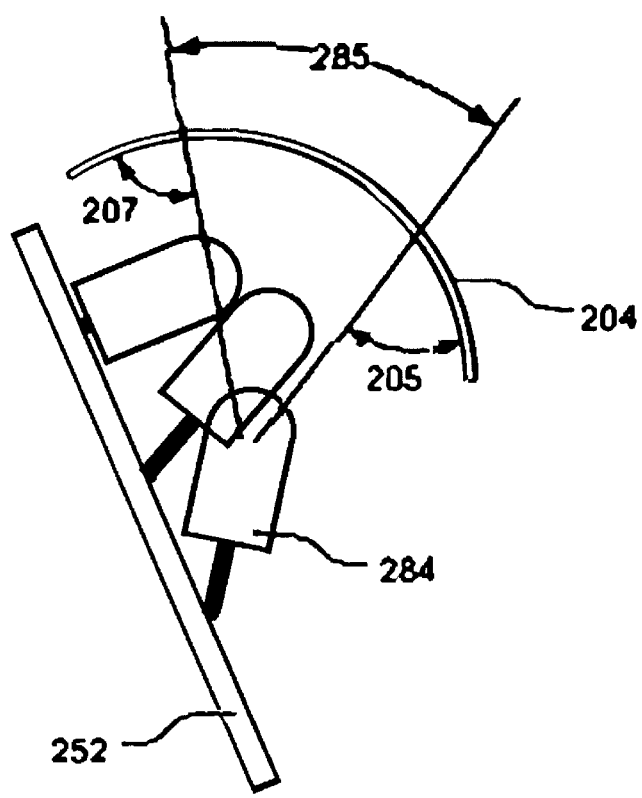
FIG. 10 is a cut away sectional view of an integrated lighting module of FIG. 6 along line C-C with additional component.
Figure 11:
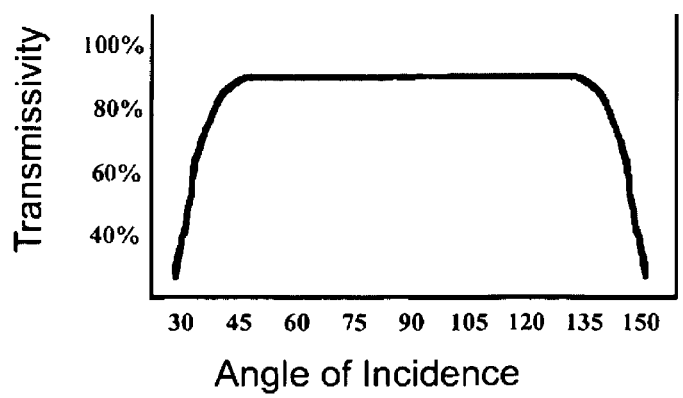
FIG. 11 illustrates a graph showing that the degree of transmissivity.

FIG. 10 illustrates another aspect of the present invention relating to the angle of the mounting of the light emitting diodes on the substrate 252. FIG. 10 illustrates another cut away sectional view of one of the integrated lighting modules 250 cut along line C-C of FIG. 6 and covering lens 204 (illustrated in FIG. 3). The covering lens 204 protects interior of the lighting fixture 200 and provides additional support for the lighting fixture 200. The covering lens 204 is typically made of clear material to allow light from the light emitting diodes to be transmitted though with minimal attenuation;

however, the covering lens 204 presents some degree of attenuation to the light. FIG. 11 illustrates a graph showing that the degree of transmissivity the covering lens 204 presents to the light from the light emitting diodes depends highly on the angle of incidence of the light on the covering lens 204. More specifically, the graph shows that the transmissivity declines drastically for angles of incidence of lower than 45° or higher than hundred and 35°.

Referring to FIGS. 10 and 11, to minimize loss of light due to the attenuation presented by the covering lens 204, the light emitting diodes of the three echelons of light emitting diodes are mounted on the substrate 252 such that the incidence angles 205 and 207 of the light from the light emitting diodes to not fall below 45° or exceed 135°.

Referring again to FIG. 6, the integrated lighting module 250 is "integrated" in that the module 250 includes, on the common substrate 252, the aforementioned echelons 260, 270, and 280 of the light emitting diodes as well as circuit elements (referred herein as the "power supply" or "power converter") to convert the readily available alternating current form of electrical power to direct current form of electrical power needed by the light emitting diodes as well as the echelons of the light emitting diodes.

Figure 12:
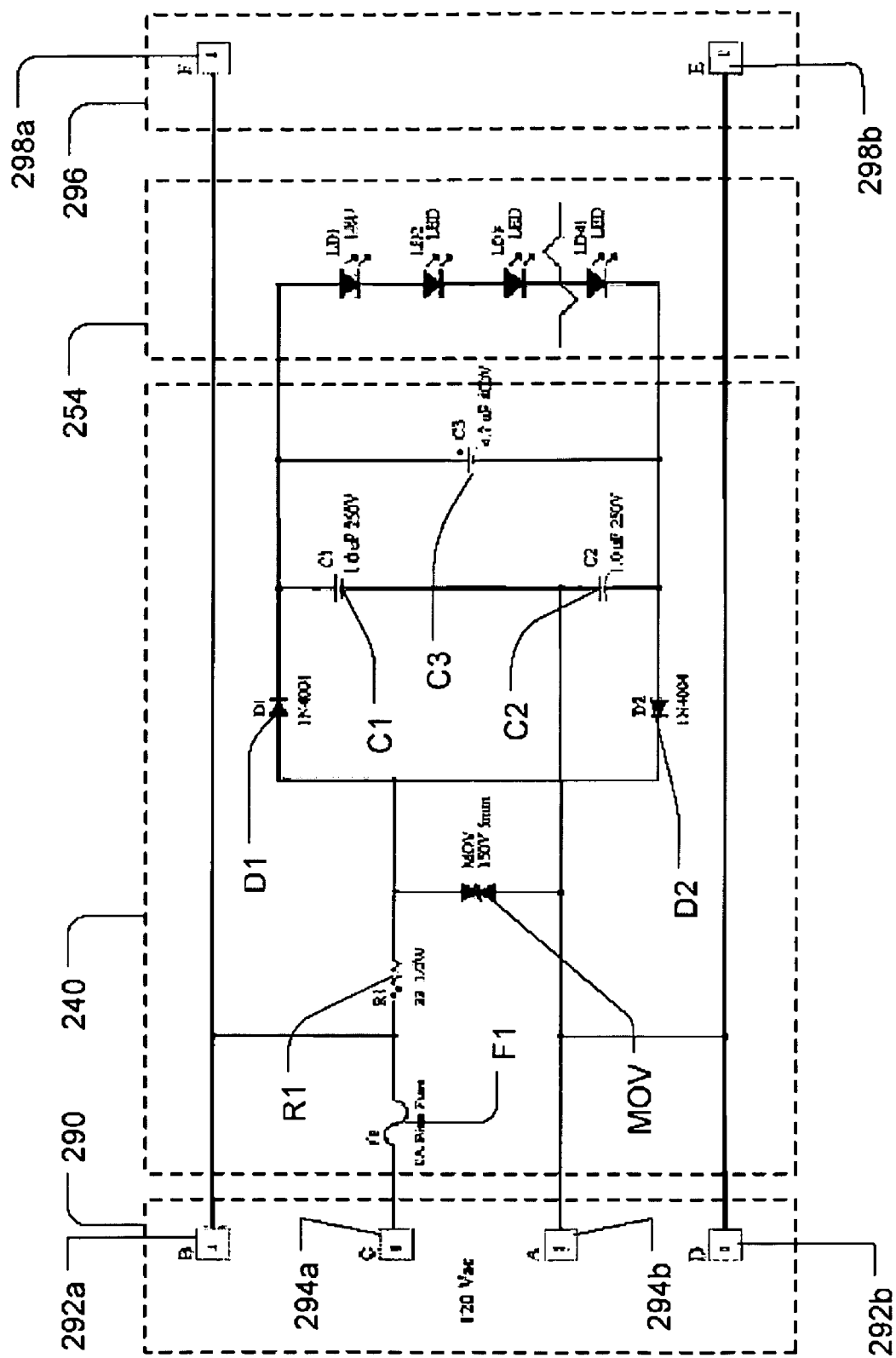
FIG. 12 is an electrical schematic representation of an integrated lighting module.

FIG. 12 is an electrical schematic representation of the integrated lighting module 250. Referring to FIGS. 6 and 12, the integrated lighting module 250 includes an input circuit 290 mounted on the mounted on the substrate 252. The input circuit 290 includes, for example, connection pads 294a and 294b adapted to connect to and an external power source and adapted to receive alternating current electrical power from the external power source. The input circuit 290 can also include and connection pads 292a and 292b adapted to connect to other integrated lighting modules 250 to receive electrical power from the other integrated lighting modules 250.

The integrated lighting module 250 includes a power converter circuit (also referred to as the "power supply") mounted on the substrate 252. The power converter circuit 240 is connected to the input circuit 290 and connected to the echelons of light emitting diodes of the integrated lighting module 250. In FIG. 12, the light emitting diodes of all of the echelons of the integrated lighting module 250 are represented by the diodes in dashed-box 254. The power converter circuit 240 is adapted to convert the input alternating current electrical power to direct current electrical power for consumption by the plurality of light emitting diodes 254.

In the power converter circuit 240, a fuse F1 provides current limiting (to prevent damaging sustained peak current) and a resistor R1 (to limit inrush current), as well as capacitors C1 and C2 (to limit steady state current). R1 could also be a negative temperature coefficient thermistor (NTC) to reduce energy loss after the initial current surge when the unit is energized. The power supply circuit 240 drives the light emitting diodes 254 in a series string configuration. Due to the current limiting components, the voltage at the supply output, at the connection points across C3, is reduced to a light emitting diode-safe drive level under load such as, for example, 132 volts. By use of capacitors C1 and C2 to limit incoming current, the disadvantages of heat dissipation in resistors or transistors are avoided. In case of no-load open circuit, capacitor C3 is rated above the nominal 340 Vdc produced by a voltage doubler circuit operating from a 120 Vac line, to avoid the possibility of component damage.

In the illustrated sample embodiment, the fuse F1 is a 1-amp Pico Fuse; the resistor R1 is a 24 ohm resistor rated at 1 watt; capacitors C1 and C2 have 1 microfarad 250 volt rating; capacitor C3 has 4.7 microfarad 400 volt rating; diodes D1 and D2 have 1N4004 rating 400 volt, 1 amp; and the MOV (metal oxide varistor) has 150 volt, 5 mm rating.

In an effort to provide high efficiency, low noise production, and low component count, a current limiting power supply utilizing non dissipative capacitive reactance was selected. By using a full wave voltage doubler configuration, improved power factor over a bridge fed capacitor input filter supply can be realized. Resistor (R1) or NTC (negative temperature coefficient) thermister provides for surge current limiting at the initial turn on and charging of C1, C2, and C3. An NTC (negative temperature coefficient) thermistor can be used since it has a high resistance at room temperature and turn on, but changes resistance to a lower value upon passing current and heating up. In that manner, dissipation losses are minimized after the unit is operating.

The MOV or metallic oxide varistor in conjunction with a series current limiting element (R1) provides transient voltage protection as found in some harsh industrial electrical environments. Components D1, D2, C1, C2, and C3 comprise a full wave voltage doubling power supply with the capacitance of C1 and C2 selected to provide capacitive reactance sufficient to limit the output current to that of the light emitting diode spec. C3 serves to reduce the ripple voltage appearing across C1 and C2 and thus reduces LED 120 Hz blinking. Do to the inherent simplicity of this power supply circuit, reliability is improved, and its low cost can permit it to be a redundant circuit on each integrated lighting module.

Mechanically, to assemble the modules 250 for easier sliding into the frames 210, some components of the power converter circuit 240 can be mounted on the back (second major surface) of the substrate 252. The integrated lighting module 250 includes an output circuit 296 mounted on the substrate 252. The output circuit 296 is connected to the input circuit 290 and is adapted to forward the alternating current electrical power to an external device such as another module 250 via its connection pads 298a and 298b.

As is apparent from the schematic of FIG. 12, integrated lighting modules 250 can be daisy-chained to each other by connecting the output pads 298a and 298b of a first integrated lighting module 250 the input pads 292a in 290b, respectively. To supply electrical power to the entire chain of the daisy-chained set of integrated lighting modules, the electrical power need be connected to only one of the set of the daisy-chained integrated lighting modules.

FIG. 5 illustrate portions of the fixture 200 having multiple integrated lighting modules 250 which are electrically connected as shown in area 258. As illustrated, a first integrated lighting module 250a is connected to an alternating current power source via its input circuit. A second integrated lighting module 250b has its input circuit connected to the output circuit of the first integrated lighting module 250a.

Dimensions of the modules 250 are in the order of inches or tens of inches. There is no requirement in the present invention that the dimensions of the modules 250 are identical. In fact, depending on the desired application, modules having various sizes may be used. For example, the length 251a of the first module 250a can be greater than the length 251b of the second module 251b.

By virtue of the cross firing light emitting diodes, lens slot 218 (of FIG. 4) in the fixture for the lens 204 is kept to minimum width thereby permitting utilization of thinnest lens material available while still maintaining mechanical integrity. This minimizes lens transmission loss. The fixture frame 210 design also positions and curves the lens to further reduce transmission attenuation by maintaining a near perpendicular relationship between the light emitting diodes of each echelon and inside surface of the lens. The fixture frame design also provides for abundant external surface area to allow for cooler operation of the light emitting diode.

Referring again to FIG. 4, the fixture frame 210 defines a multiple engagement slots 212a, 212b, and 212c allowing engagement of the modules 250 within the fixture 200. The engagement slots 212a, 212b, and 212c are generically or collectively referred to herein as engagement slots 212. In the illustrated example of FIG. 4, the module 250 is engaged to engagement slots 212a and 212b forming an engagement angle 213 relative to the rest of the fixture frame 210. It is readily apparent from the Figures that if the module 250 is engaged to engagement slots 212a and 212c, the engagement angle would change to some value other than the value of angle 213. This is one of the techniques in which the angle and the direction of the light from the light emitting diodes can be adjusted.

The fixture frame 210 further defines grooves 214 providing convenient pocket for engagement with electrical wires that may run along the fixture 200.

Figures 13A, 13B:
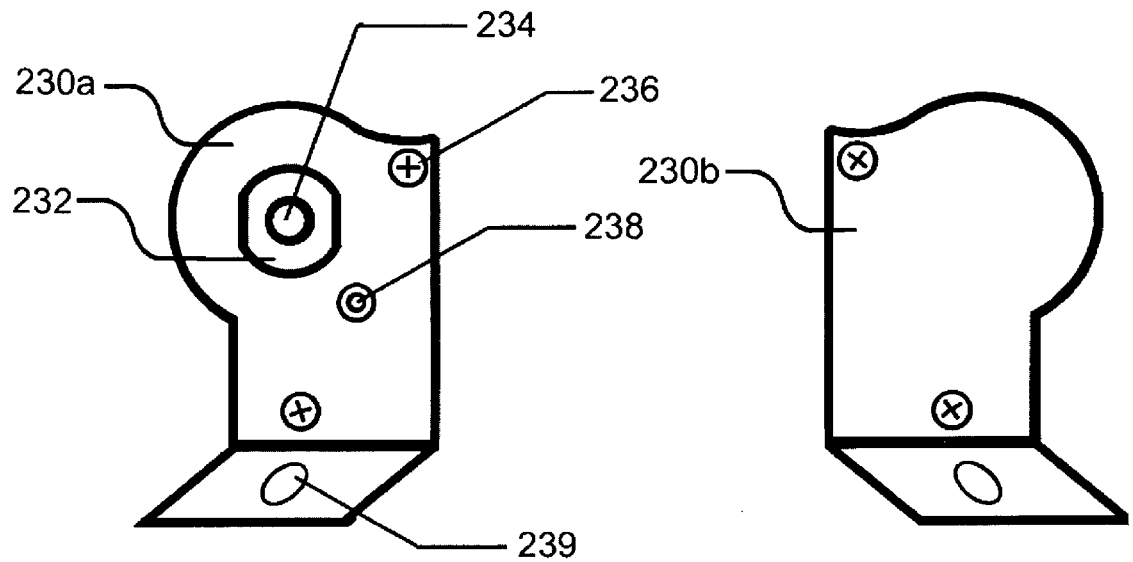
FIGS. 13A and 13B illustrate end plates of the end jamb fixture of FIG. 3 in more detail.

FIGS. 13A and 13B illustrate end plates 230a and 230b which are attached to the ends of the frame 210, one at each end as partially illustrated in FIG. 3.

Figure 14:
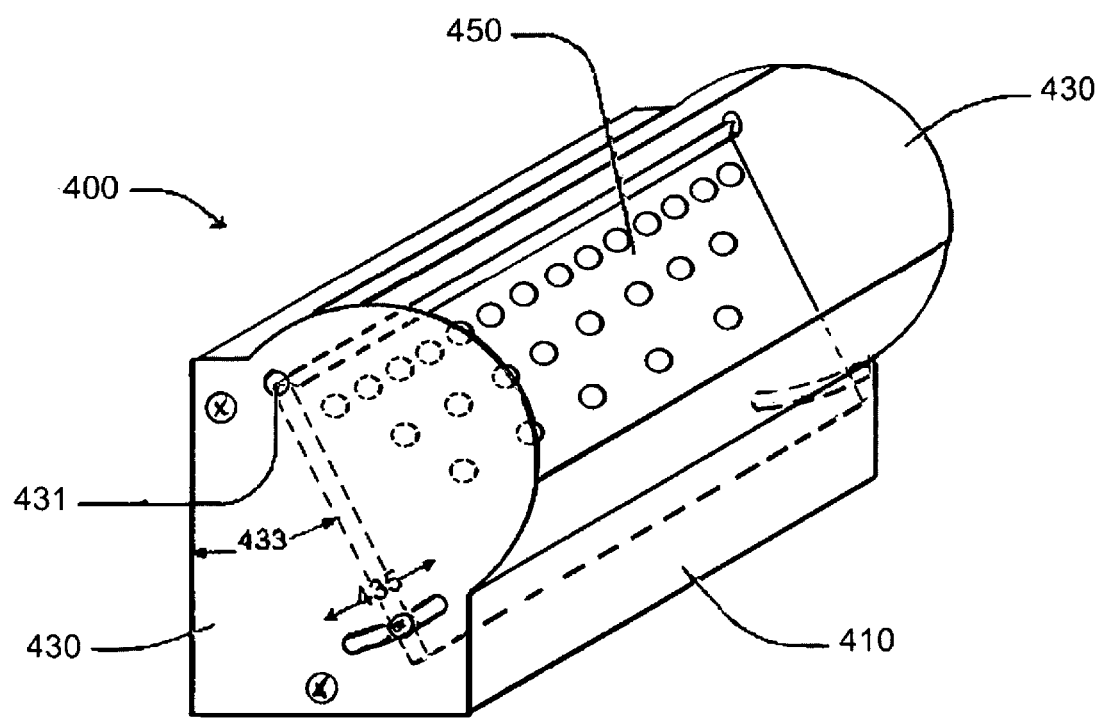
FIG. 14 illustrates an alternative embodiment of end jamb fixture of the present invention.

FIG. 14 illustrates an alternative embodiment of the present invention. FIG. 14 illustrates a light fixture 400 that is similarly configured to the light fixture 200 of FIGS. 3 through 12. However, in the light fixture 400, portions of its extrusion frame 410 and portions of its end plates 430 are configured differently. The integrated lighting module 450 is similarly configured to the integrated lighting module 250 of FIGS. 4 through 7. Here, the integrated lighting module 450 has a first end that is pivotally engaged to the extrusion frame 410 as illustrated as pivot point 431. A second end of the integrated lighting module 450 is movably or slide-ably engaged to the end plate 430 in the direction illustrated by arrows 435. Consequently, the angular position 433 of the integrated lighting module 450 is angularly adjustable relative to the extrusion frame 410.

Figure 16:
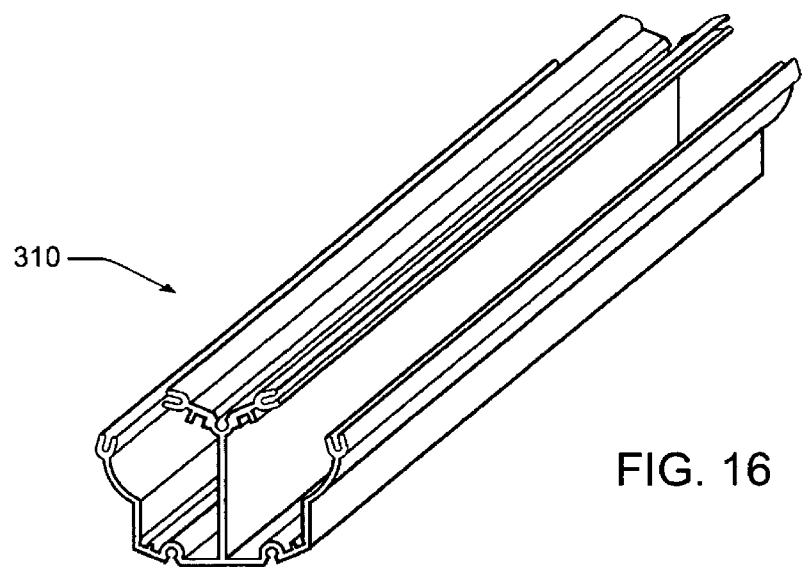
FIG. 16 is a perspective view of a portion of the center mullion fixture of FIG. 15.
Figure 15:
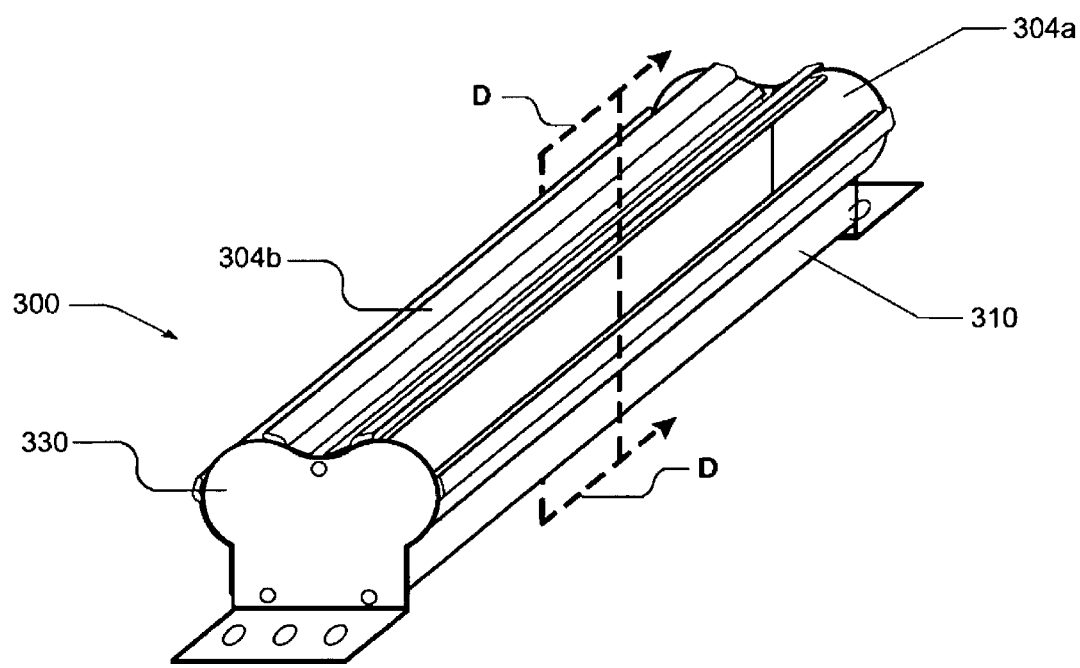
FIG. 15 is a perspective view of an center mullion fixture embodying yet another aspect of the present invention.
Figure 17:
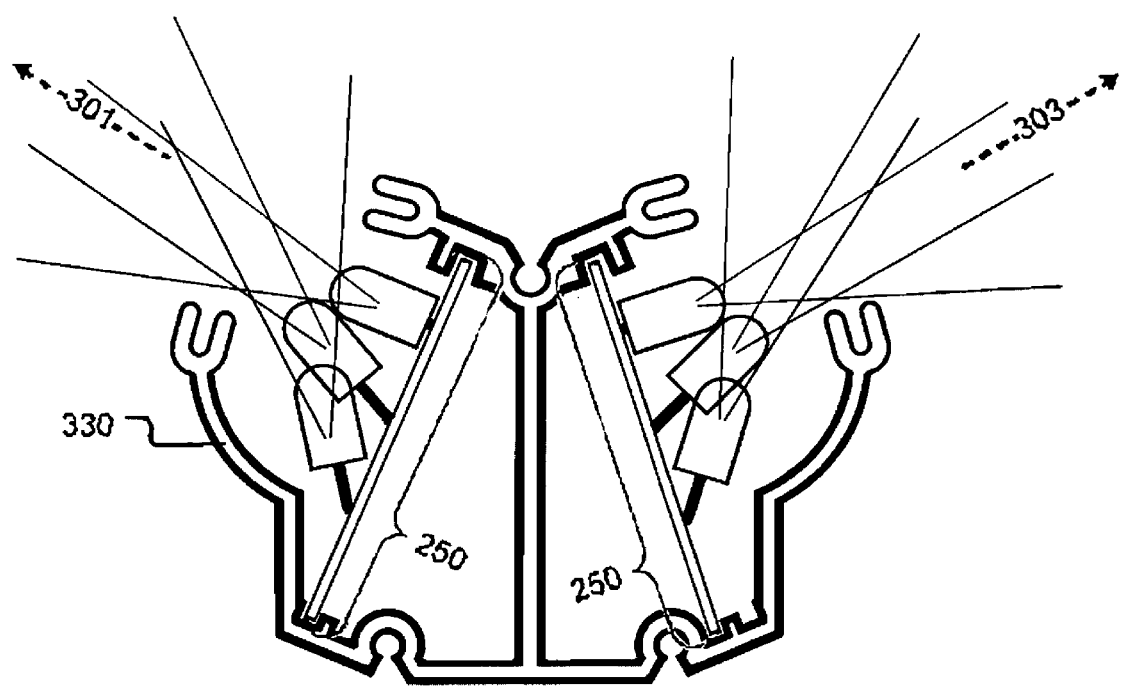
FIG. 17 is a cut away sectional view of the center mullion fixture of FIG. 15 cut along plane D-D.

FIG. 15 is a perspective view of the lighting fixture 300 of FIG. 1. Here, the lighting fixture 300 is a center mullion fixture 300 adaptable for placement at a mullion of the display stand 100 of FIG. 1. The Center Mullion Fixture 300 includes a fixture frame 310 defining an opening covered by a covering lenses 304a and 304b (generically or collectively referred to as 304). FIG. 16 is a perspective view of the fixture frame 310. FIG. 17 illustrates a cut away sectional view of the center mullion fixture 300 cut along plane D-D. To avoid clutter, the covering lens 304 is not illustrated in FIG. 18. Illustrated in FIG. 17 but not shown in FIG. 15 is a cutaway side view of an integrated lighting system 250. The integrated lighting system 250 of FIG. 17 is the same as the integrated lighting system 250 illustrated in FIGS. 4 through 7 and discussed above.

The center mullion fixture 300 has two openings covered by covering lenses 304a and 304b. This is because the center mullion fixture 300 is adapted to provide light generally in two directions as indicated by arrows 301 and 303. For the same reason, the center mullion fixture 300 includes two sets of integrated lighting modules 250. The covering lenses 304a and 304b are not shown in FIG. 17.

Figure 18B:
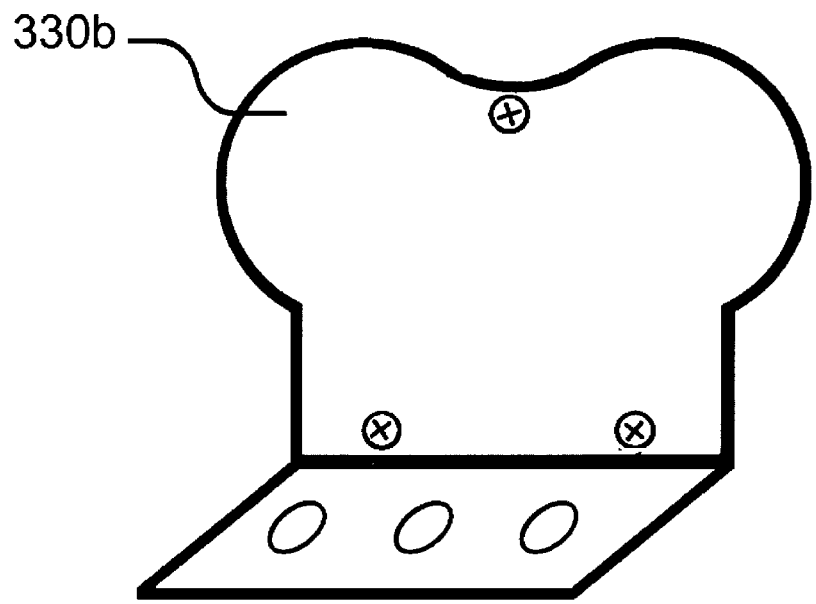
FIGS. 18A and 18B illustrate end plates of the center mullion fixture of FIG. 15 in more detail.
Figure 18A:
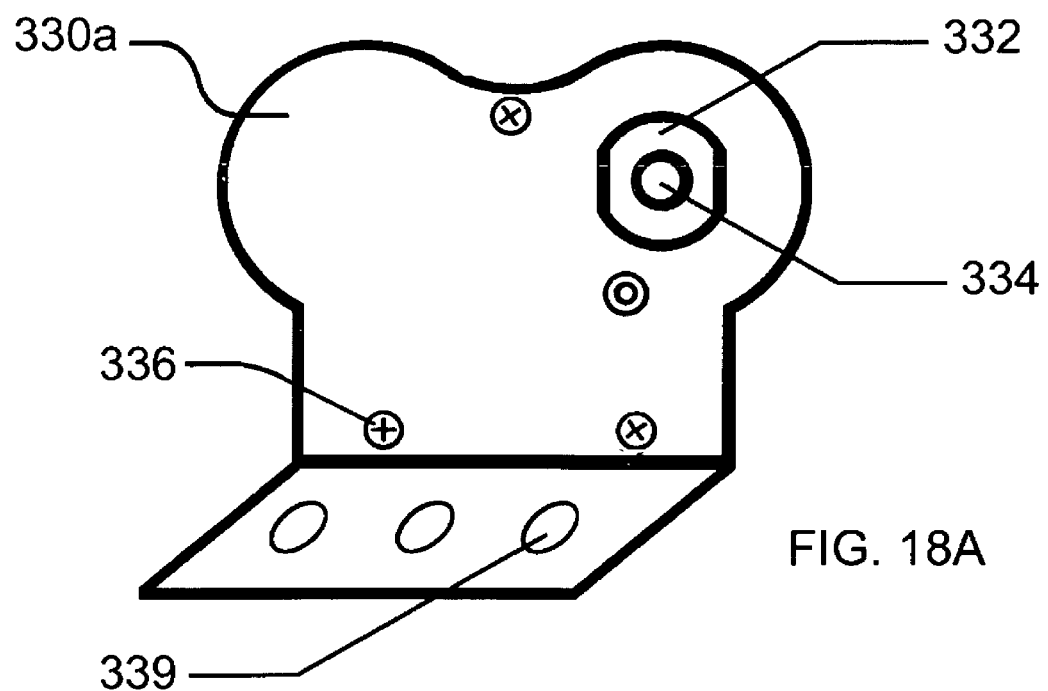

FIGS. 18A and 18B illustrate end plates 330a and 330b which are attached to the ends of the frame 310, one at each end as partially illustrated in FIG. 15. For convenience of discussion herein, the end plates 330a and 330b, generically or collectively, are referred to using reference number 330. The end plate 330 includes a stress relief 332, and defines several opening such as, for example only, wire access opening 334, end plates screw hole 336, and mounting hole 339. Also, a ground lug engagement hole 338 allows for electrical grounding of the electrical components of the integrated lighting modules 350.

Figure 19:
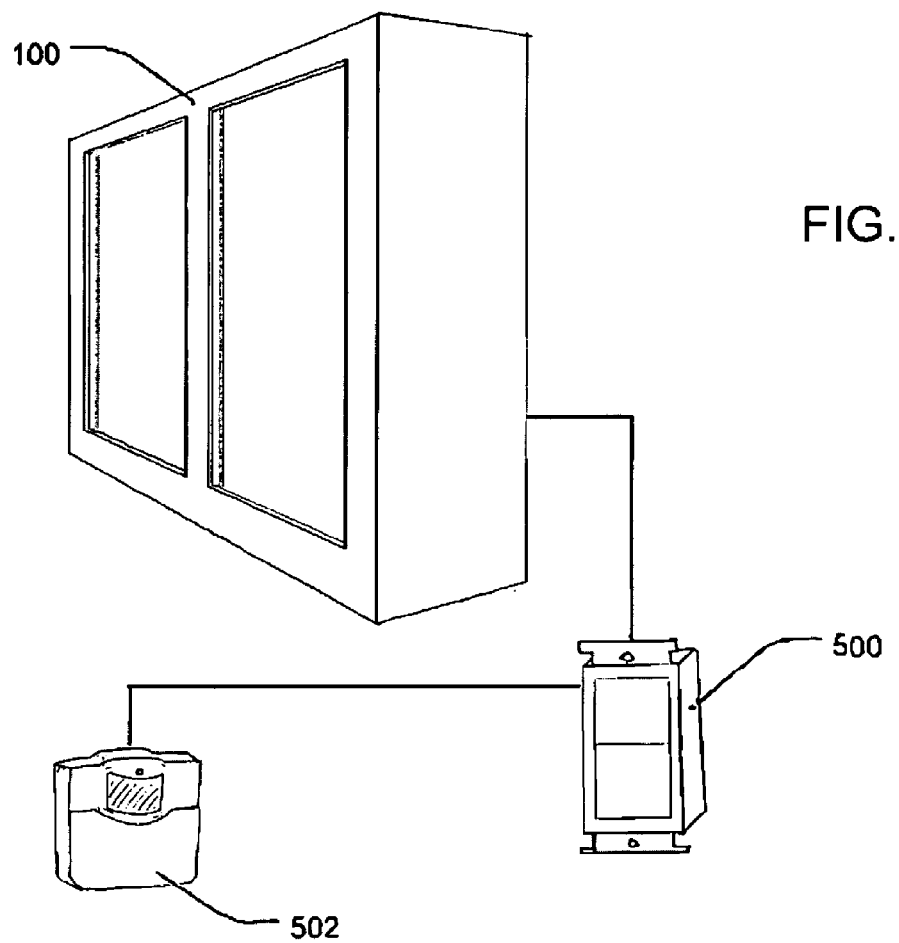
FIG. 19 illustrates another aspect of the present invention in a motion sensitive lighting system.

FIG. 19 illustrates another aspect of the present invention. In FIG. 19, the display stand 100 of FIGS. 1 and 2 connected to a controller 500 and a motion detector 502. When motion is detected by the motion detector 502, signal is sent to the controller 500 connected to the motion detector 502. Upon receiving the signal from the motion detector 502, the controller 500 causes application of power to the lighting fixtures of the displaced and 100. The application of power means either that the lighting fixtures of the displaced and 100 was in unpowered state and that power was applied to turn on the lighting fixtures of the displaced and 100, or the lighting fixtures of the displaced and 100 was dimmed at a lower power and that power was increased to increase the brightness of the lighting fixtures of the displaced and 100.

The controller 500 can be programmed to power off or power down (dim) the lighting fixtures on various conditions such as, for example, at predetermined time periods when the store is closed; when no motion is detected by the motion detector 502, or after a predetermined time period following the detection of motion by the motion detector 502.

Figure 20:
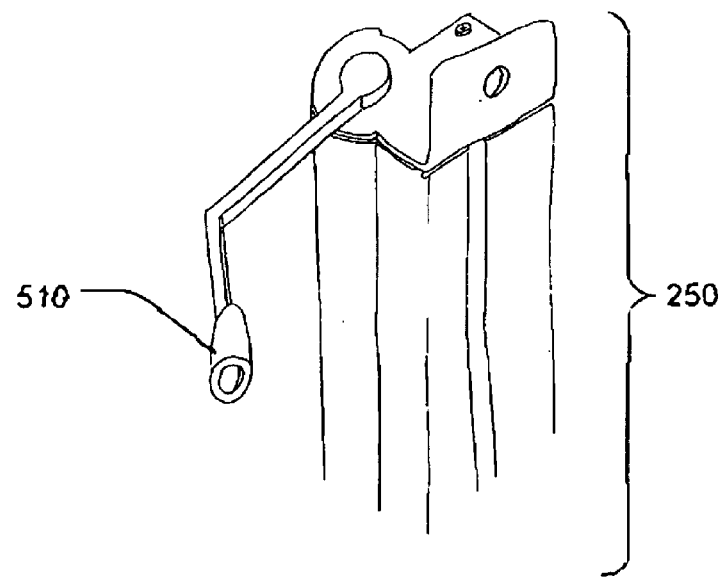
FIG. 20 illustrates yet another aspect of the present invention in a motion sensitive lighting system.

FIG. 20 illustrates another aspect of the present invention. In FIG. 20, the integrated lighting module 250 is connected to a motion sensor 510 including a power switch. The power switch operates to apply power to the converter circuit (of the integrated lighting module 250, see FIG. 12) when motion is detected by the motion sensor 510. Using this embodiment, both the motion sensor 510 and the integrated lighting module 250 can be mounted inside the display stand 100 of FIG. 1.

Figure 21:
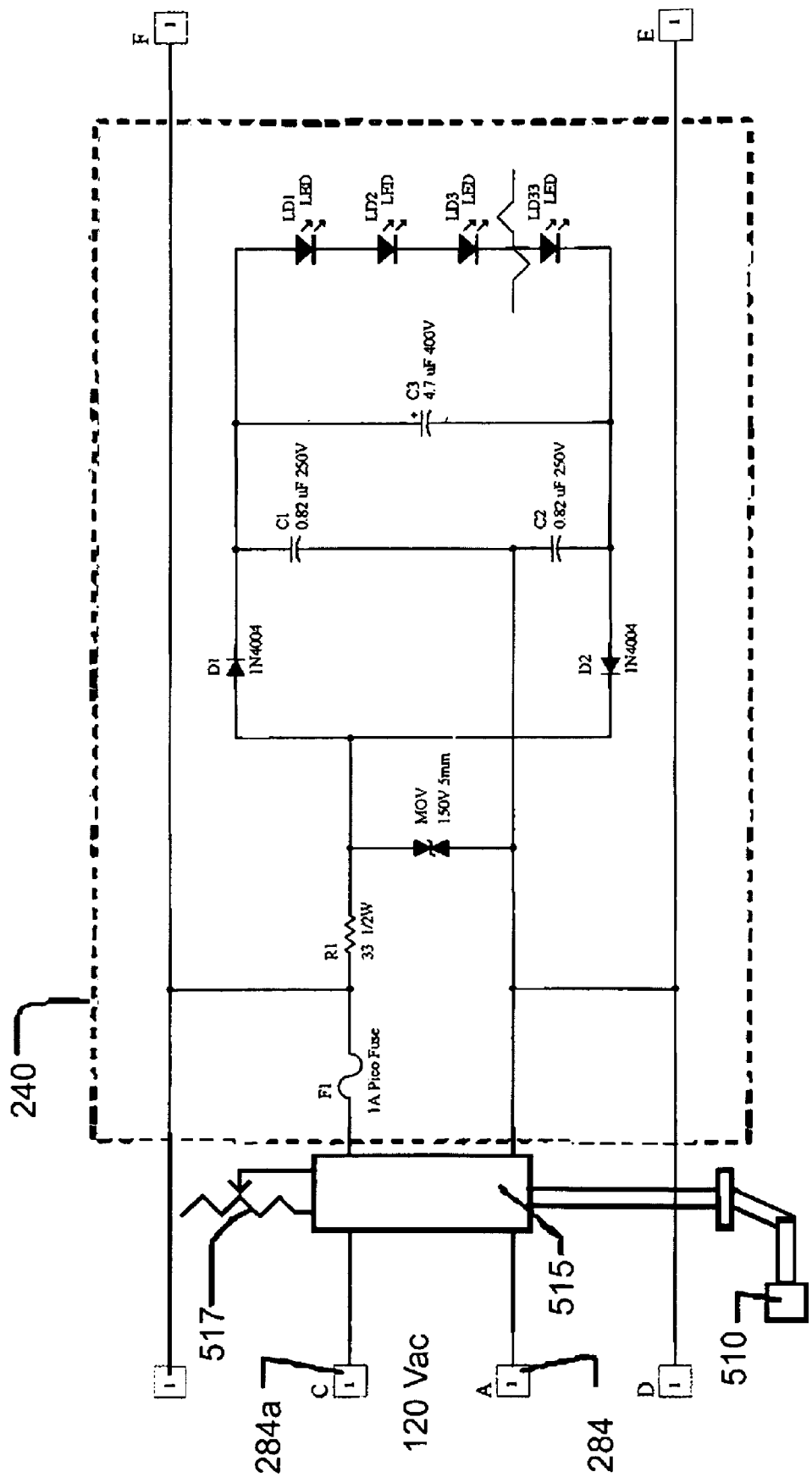
FIG. 21 is an electrical schematic representation of an integrated lighting module in accordance with another aspect of the present invention.

FIG. 21 is an electronic schematic representation of the integrated lighting module 250 of FIG. 20. The electronic schematic of FIG. 21 is identical to the electronic schematic of FIG. 12 except that a controller circuit 515 is connected between the connection pads (294a and 294b) and the power converter circuit 240. The controller circuit 515 is connected to the motions sensor 510 of FIG. 20. The controller circuit 515 includes a relay, sensor interface, and an adjustable shut off delay circuit. The replay is, for example, a conventional relay or a solid state relay such as a zero voltage switching (ZVS) solid state relay (SSR). The sensor interface is connected to the external sensor. The adjustable shut off delay circuit is connected to an external time delay adjusting potentiometer 517.

Figure 22:
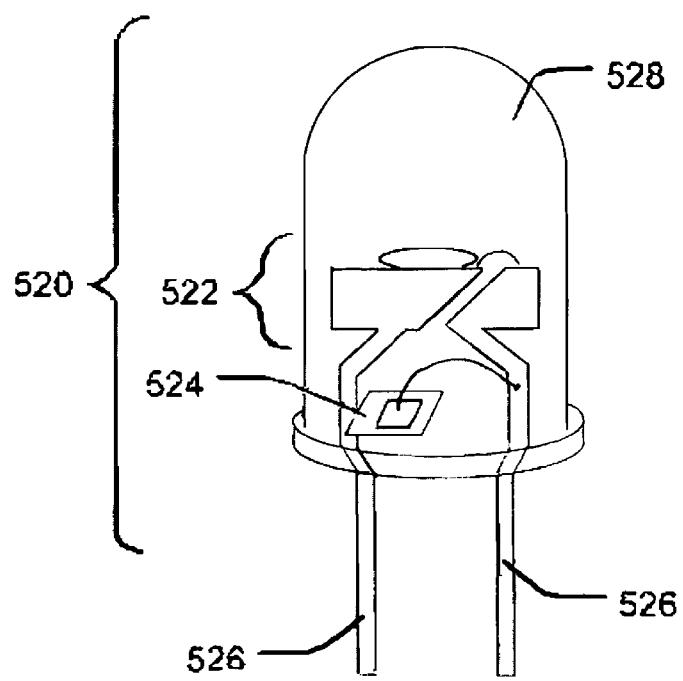
FIG. 22 illustrates a light emitting diode package in accordance with yet another aspect of the present invention.
Figure 23:
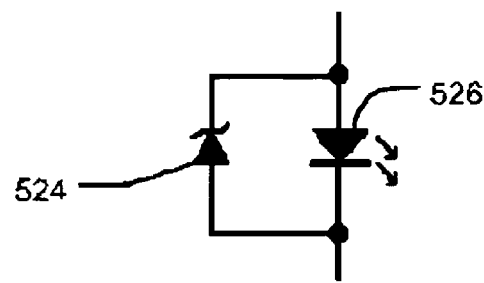
FIG. 23 is an electrical schematic representation of the light emitting diode package of FIG. 22.

FIGS. 22 and 23 illustrate another aspect of the present invention. In FIG. 22, a light emitting diode package 520 includes a light emitting diode 522 encased within a clear epoxy packaging material 528. The light emitting diode 522 is connected to two metal leads 526 coming out of the epoxy packaging 528 for electrical connection and for heat spreading. Also encased within the epoxy packaging material 528 is a zener diode 524 that is also connected to the two metal leads 526. FIG. 23 is an electrical schematic of the light emitting diode package 520. As illustrated, the zener diode 524 is connected electrically parallel to the light emitting diode 526.

During normal operations, electrical power passes through the light emitting diode 526 causing the light emitting diode 526 to emit light. The light emitting diode 526 has a normal operating voltage range such as from 1.5 volts to 3.8 volts. The zener diode 524 is selected such that its reverse breakdown voltage is slightly above the upper limit of the normal operating voltage of the light emitting diode 526. In the present example, the zener diode 524 has a reverse breakdown voltage of approximately 4 volts. When the light emitting diode 526 fails causing the circuit to open, the voltage normally applied to the light emitting diode 526 is now applied to the zener diode 524. As the electrical current piles up at the zener diode 524, voltage across the zener diode 524 increases until the zener diode 524 breaks down and begins to conduct. Accordingly, a failed light emitting diode does not prevent the flow of current that is needed in other components such as other light emitting diodes.

The placement of the zener diode 524 inside the light emitting diode package 520 as shown in FIG. 22 is one possible embodiment of the present invention; however, this is not the only possible configuration under the present invention. For example, referring again to FIG. 12 and continuing to refer to FIG. 23, in the integrated lighting system 250, a zener diode, such as the diode zener 524, can be connected electrically parallel to one or more of the light emitting diodes of the echelons of light emitting diodes represented by the diodes in dashed-box 254. In this alternate embodiment, the zener diode can be placed outside the light emitting diodes but mounted on the substrate 510 such as the printed circuit board (PCB) 510.

In an alternate embodiment of the present invention, the light emitting diode package 520 can be used in place of diodes 264, 274, and 284 of echelons 260, 270, and 280 illustrated in FIGS. 5 through 7. In another alternate embodiment of the present invention, a zener diode is connected across the each of the light emitting diodes of the integrated lighting module 250 electrically parallel to each of the light emitting diodes.

From the foregoing, it will be appreciated that the present invention is novel and offers advantages over the current art. Although a specific embodiment of the invention is described and illustrated above, the invention is not to be limited to the specific forms or arrangements of parts so described and illustrated. For example, differing configurations, sizes, or materials may be used to practice the present invention. The invention is limited by the claims that follow.

What is claimed is:

1. A display stand comprising:
   panels defining at least partially enclosed space, said panels also defining a mullion, a corner, or both;
   a lighting fixture running along the mullion or the corner;
   said lighting fixture including an integrated lighting system, each integrated lighting system integrating a plurality of light emitting diodes and a power supply on a common substrate, said lighting fixture including:
      an input circuit mounted on said substrate, said input circuit adapted to receive alternating current electrical power from an external source;
      a plurality of light emitting diodes mounted on said substrate;
      a power converter circuit mounted on said substrate, said power converter circuit connected to the input circuit and connected to the light emitting diodes;
      wherein said power converter circuit is adapted to convert the input alternating current electrical power to direct current electrical power for consumption by said plurality of light emitting diodes.

2. The display stand recited in claim 1 further comprising:
   a motion detector adapted to detect motion;
   a controller connected to said motion detector and connected to said lighting fixture of the display stand; and
   wherein said controller controls applies power to said lighting fixture upon detection of motion by said motion detector.

3. A lighting fixture comprising:
   an extrusion frame;
   a plurality of integrated lighting modules engaged to said extrusion frame, each module including:
      a substrate;
      an input circuit mounted on said substrate, said input circuit adapted to receive alternating current electrical power from an external source;
      a plurality of light emitting diodes mounted on said substrate;
      a power converter circuit mounted on said substrate, said power converter circuit connected to the input circuit and connected to the light emitting diodes;
      wherein said power converter is adapted to convert the input alternating current electrical power to direct current electrical power for consumption by said plurality of light emitting diodes;
      an output circuit mounted on said substrate, said output circuit connected to said input circuit and adapted to forward the alternating current electrical power to an external device;
   a first integrated lighting module of said plurality of integrated lighting modules connected to an alternating current power source via the input circuit of said first integrated lighting module; and
   a second integrated lighting module of said plurality of integrated lighting modules, the input circuit of said second integrated lighting module connected to the output circuit of said first integrated lighting module.

4. The lighting fixture recited in claim 3 wherein:
   said first integrated lighting module includes a first number of light emitting diodes; and
   said second integrated lighting module includes a second number of light emitting diodes, the second number of light emitting diodes less than the first number of light emitting diodes.

5. The lighting fixture recited in claim 3 wherein:
   said first integrated lighting module having a first length; and
   said second integrated lighting module having a second length, the second length less than the first length.

6. The lighting fixture recited in claim 3 wherein said extrusion frame defines multiple insertion slots allowing for engagement of said integrated lighting modules at varying mounting angles relative to the rest of the extrusion frame.

7. The lighting system of claim 3, wherein said extrusion frame defines at least one groove adapted to engage wire running along the lighting system.

8. An integrated lighting system comprising:
   a substrate;
   an input circuit mounted on said substrate, said input circuit adapted to receive alternating current electrical power from an external source;
   a plurality of light emitting diodes mounted on said substrate;
   a power converter circuit mounted on said substrate, said power converter circuit connected to the input circuit and connected to the light emitting diodes;
   wherein said power converter is adapted to convert the input alternating current electrical power to direct current electrical power for consumption by said plurality of light emitting diodes; and
   an output circuit mounted on said substrate, said output circuit connected to said input circuit and adapted to forward the alternating current electrical power to an external device.

9. The integrated lighting system recited in claim 8 wherein the power converter includes a power factor correction circuit.

10. The integrated lighting system recited in claim 8 wherein a zener diode is connected electrically parallel to at least one of the light emitting diodes.

11. The lighting fixture recited in claim 8 further comprising:
- a motion sensor;
- a power switch connected to said motion sensor and to said power converter circuit;
- wherein said power switch operates to apply power to the converter circuit when motion is detected.

12. A lighting fixture comprising:
- an extrusion frame;
- an integrated lighting module engaged to said extrusion frame, said each integrated lighting modules including:
  - a substrate;
    - an input circuit mounted on said substrate, said input circuit adapted to receive alternating current electrical power from an external source;
    - a plurality of light emitting diodes mounted on said substrate;
    - a power converter circuit mounted on said substrate, said power converter circuit connected to the input circuit and connected to the light emitting diodes;
    - wherein said power converter is adapted to convert the input alternating current electrical power to direct current electrical power for consumption by said plurality of light emitting diodes;
- wherein:
  - said integrated lighting module having a first end pivotally engaged to said extrusion frame; and
  - said integrated lighting module having a second end movably engaged to said extrusion frame whereby said integrated lighting module being angularly movable relative to the extrusion frame.

* * * * *